(12) United States Patent
Moriya

(10) Patent No.: US 8,498,911 B2
(45) Date of Patent: Jul. 30, 2013

(54) PARTICLE GENERATION FACTOR DETERMINING SYSTEM, CHARGING METHOD AND STORAGE MEDIUM

(75) Inventor: Tsuyoshi Moriya, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 493 days.

(21) Appl. No.: 12/820,692

(22) Filed: Jun. 22, 2010

(65) Prior Publication Data

US 2010/0332364 A1 Dec. 30, 2010

(30) Foreign Application Priority Data

Jun. 24, 2009 (JP) ................................. 2009-149697

(51) Int. Cl.
*G06Q 40/00* (2012.01)
(52) U.S. Cl.
USPC .......................................................... 705/34
(58) Field of Classification Search
None
See application file for complete search history.

(56) References Cited

U.S. PATENT DOCUMENTS

| 6,466,895 B1* | 10/2002 | Harvey et al. ................. 702/181 |
| 2001/0044779 A1* | 11/2001 | Iima et al. ........................ 705/52 |
| 2005/0197961 A1* | 9/2005 | Miller et al. ..................... 705/52 |
| 2009/0212211 A1* | 8/2009 | Iwasaki et al. ................ 250/307 |

FOREIGN PATENT DOCUMENTS

JP 2009212453 9/2009

* cited by examiner

*Primary Examiner* — Ryan Zeender
*Assistant Examiner* — Kristie A Mahone
(74) *Attorney, Agent, or Firm* — Pearne & Gordon LLP

(57) ABSTRACT

Provided is a charging method capable of offering a user an incentive to use a particle generation factor determining system. In the particle generation factor determining system including a user interface device 11 through which a user inputs a particle map and a server 13, the server 13 calculates accuracy of each of multiple particle generation factors based on the particle map; the user interface device 11 displays the calculated accuracy or a title of generation-factor-relevant information 27 on each particle generation factor corresponding to this accuracy; the server 13 provides the generation-factor-relevant information 27 to the user interface device 11; a charged fee for providing particle generation-factor-relevant information 27 is determined based on accuracy of a particle generation factor corresponding to the provided generation-factor-relevant information 27.

9 Claims, 12 Drawing Sheets

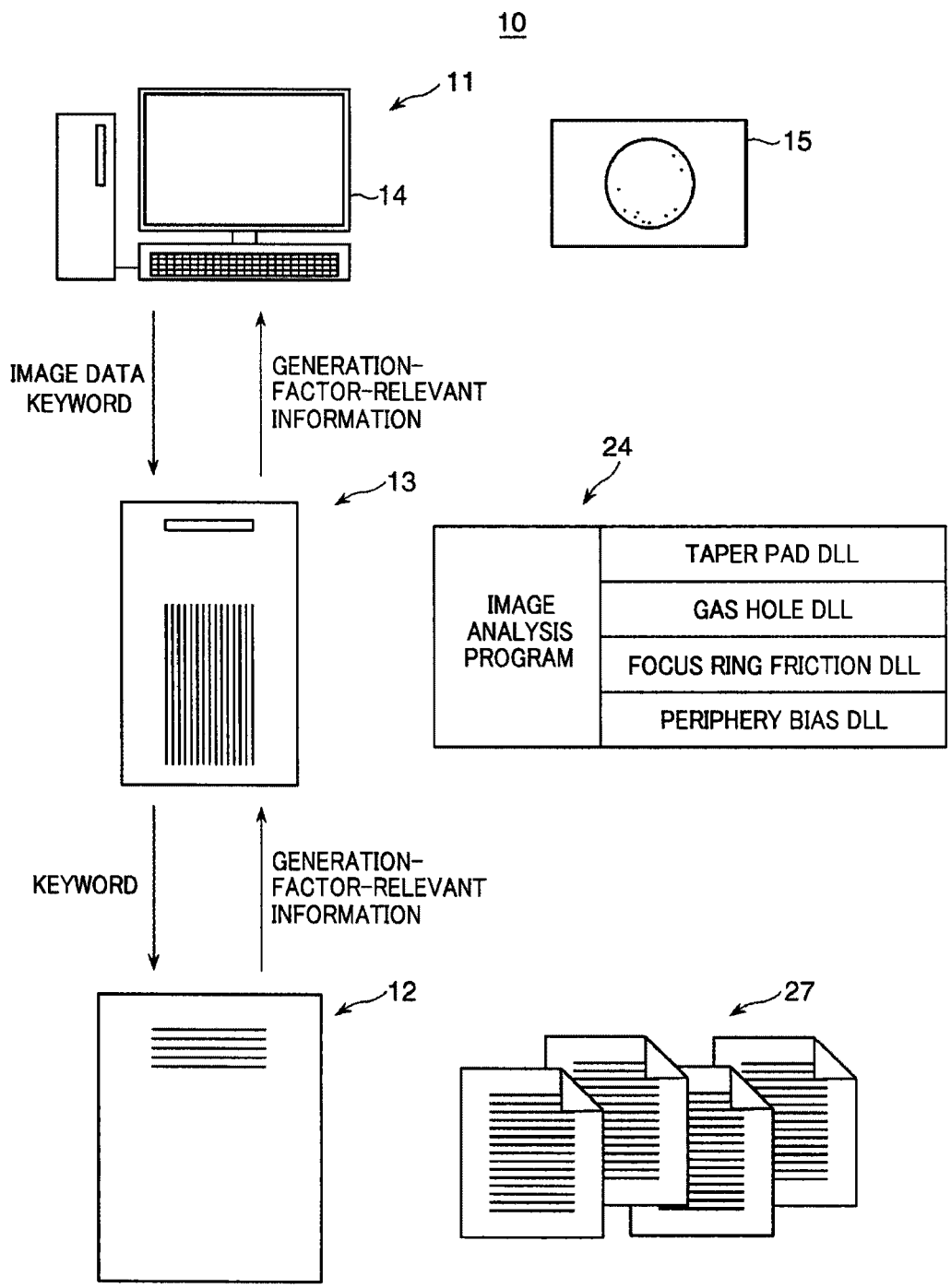

FIG. 10

REGARDING TAPER PAD (watermark text diagonally: SUZUKI@abc.co.jp  09.05.15, repeated)

```
* * * * * * * * * * * * * * * *
*
* * * * * * * * * * *
* * * * * * * *
* * * * * * * * * * * * *
* * * * * * * * *
* * * * * * * * * * * * * * *
* * * * * * * * * * *
* * * * * * * * * * * *

* * * * * * * * * *
* * * * * * * * * *
* * * * * * * * * * * * *
* * *
```

PARTICLE GENERATION FACTOR DETERMINING SYSTEM, CHARGING METHOD AND STORAGE MEDIUM

CROSS-REFERENCE TO RELATED APPLICATION

This application claims the benefit of Japanese Patent Application No. 2009-149697 filed on Jun. 24, 2009, the entire disclosures of which are incorporated herein by reference.

FIELD OF THE INVENTION

The present disclosure relates to a particle generation factor determining system, a charging method, and a storage medium, and more particularly, to a method for charging a fee for providing information on a particle generation factor in a particle generation factor determining system.

BACKGROUND OF THE INVENTION

Typically, in a substrate processing system which fabricates a semiconductor device using a semiconductor wafer (hereinafter, simply referred to as "wafer"), particles may be adhered to the wafer when a plasma process is performed on the wafer or when the wafer is transferred, and the adhered particles cause defects in the semiconductor device.

Particles may be generated due to various factors such as a mechanical contact between the wafer and a component part of the substrate processing system or a chemical reaction between a processing gas and other materials. In the substrate processing system, a large number of semiconductor devices are fabricated by performing a plasma process on a lot of wafers, and, thus, if particle generation factors are not removed, a yield of the semiconductor devices becomes extremely low. Therefore, in the substrate processing system, it is very important to find the generation factors of particles and remove the generation factors.

Accordingly, the present inventor has developed a particle generation factor determining system, which enables a user of the substrate processing system who has little knowledge about particle generation factors to accurately know the particle generation factors (see, for example, Patent Document 1).

This particle generation factor determining system performs an image analysis on image data of the wafer to which the particles are adhered and provides the user with a possibility (accuracy) that each particle generation factor is a true factor, thereby helping the user determine particle generation factors.

Further, an information providing system such as the above-described particle generation factor determining system charges a fee for providing information and collects a fee for using the information providing system from users.
Patent Document 1: Japanese patent application No. 2008-056431

However, typically, in the information providing system, the fee for using the information providing system has been calculated based on the number (kind) of information provided to the user or the number of times the user uses the information providing system, but not based on quality of the provided information or a level of contribution to the solution of a problem. That is, even if the provided information is not helpful for the user, the user is needed to pay the fee therefor. Accordingly, it is not easy for the user to know cost effectiveness of using the information providing system, and, thus, it is impossible to offer the user an incentive to use the information providing system, which results in a decrease in usefulness of the information providing system.

BRIEF SUMMARY OF THE INVENTION

In view of the foregoing, the present disclosure provides a particle generation factor determining system, a charging method, and a storage medium capable of offering a user an incentive to use the particle generation factor determining system.

In accordance with one aspect of the present disclosure, there is provided a charging method in a particle generation factor determining system including a user interface device through which a user inputs first information on a particle adhered to a substrate and having a display, and a server which checks a possibility of each of multiple particle generation factors. The charging method includes a score calculating process in which the server receives the inputted first information and calculates the possibility of each of the multiple particle generation factors as a score based on the received first information; an information displaying process in which the user interface device displays, on the display, the calculated score and a part of second information on the particle generation factor corresponding to the score; and a charging process in which the server provides the second information to the user interface device in response to selection of the displayed part of the second information and charges a fee for providing the second information. In the charging process, the charged fee may be determined based on the score of the particle generation factor corresponding to the provided second information, and all of the second information or detailed information of the second information may be provided to the user interface device.

In the charging process, the charged fee may be determined based on at least one of contribution of the second information to a profit, an evaluation value of a former user about the second information, the number of times the second information has been provided until now, and an elapsed time from when the second information was last provided.

In the charging process, the charged fee may be determined based on a way of providing the second information.

In the charging process, the charged fee may be determined based on a category of the second information.

The first information may include image data of the particle. In the information displaying process, the server may calculate the score based on a result of an image analysis of the image data.

The server may obtain a first keyword related to each of the multiple particle generation factors, and select and obtain the second information based on the obtained first keyword.

The first information may include document data related to the particle. The user interface device may extract a second keyword from the document data by text mining, and the server may select and obtain the second information based on the extracted second keyword.

The particle generation factor determining system may further include a database device. The second information including document data may be stored in the database device, and the database device may extract a third keyword from the second information by text mining, prior to the selection of the second information.

In accordance with another aspect of the present disclosure, there is provided a particle generation factor determining system including: a user interface device through which a user inputs first information on a particle adhered to a substrate and having a display; and a server that checks a possibility of each of multiple particle generation factors. The server may receive the inputted first information and calculate the possibility of each of the multiple particle generation factors as a score based on the received first information. The user interface device may display, on the display, the calculated score and a part of second information on the particle generation factor corresponding to the score. The server may provide the second information to the user interface device in response to selection of the displayed part of the second information and charge a fee for providing the second information. The charged fee for providing the second information may be determined based on the score of the particle generation factor corresponding to the provided second information. All of the second information or detailed information of the second information may be provided to the user interface device.

In accordance with still another aspect of the present disclosure, there is provided a computer-readable storage medium that stores a program for executing a charging method in a particle generation factor determining system including a user interface device through which a user inputs first information on a particle adhered to a substrate and having a display, and a server which checks a possibility of each of multiple particle generation factors. The charging method includes a score calculating process in which the server receives the inputted first information and calculates the possibility of each of the multiple particle generation factors as a score based on the received first information; an information displaying process in which the user interface device displays, on the display, the calculated score and a part of second information on the particle generation factor corresponding to the score; and a charging process in which the server provides the second information to the user interface device in response to selection of the displayed part of the second information and charges a fee for providing the second information. In the charging process, the charged fee may be determined based on the score of the particle generation factor corresponding to the provided second information, and all of the second information or detailed information of the second information may be provided to the user interface device.

In accordance with the above-mentioned charging method, the particle generation factor determining system, and the storage medium, a possibility of each of multiple particle generation factors is calculated as a score based on first information on particles adhered to a substrate and a fee to be charged for providing second information on each particle generation factor is determined based on the score of the particle generation factor corresponding to the provided second information. Therefore, it is highly likely that the particle generation factor corresponding to the second information of a high fee is a true particle generation factor. Accordingly, it is easy for the user to know cost effectiveness of using the particle generation factor determining system, and, thus, it is possible to offer the user an incentive to use the particle generation factor determining system.

Further, in accordance with the above-mentioned charging method, a fee to be charged is determined based on at least one of contribution of the second information to a profit, an evaluation value of a former user about the second information, the number of times the second information has been provided until now, and an elapsed time from when the second information was last provided. Therefore, a value of the second information can be reflected in the fee to be charged, and, thus, it is possible to determine the reasonable fee to be charged. Accordingly, it is possible to offer the user more incentives to use the particle generation factor determining system.

In accordance with the above-mentioned charging method, a fee to be charged is determined based on a type of providing the second information. Therefore, it is possible to set the fee to be charged appropriately based on the degree of use of the second information.

In accordance with the above-mentioned charging method, a fee to be charged is determined based on a category of the second information. Therefore, it is possible to set the fee to be charged appropriately based on economic merit which a user can obtain from the second information.

In accordance with the above-mentioned charging method, a particle generation factor is calculated as a score based on a result of an image analysis of image data of a particle. Therefore, it is possible to obtain the second information just by preparing the image data obtained by capturing the substrate, thereby saving the user a lot of trouble.

In accordance with the above-mentioned charging method, the first keyword related to each of multiple particle generation factors is obtained and the second information is selected and obtained based on the obtained first keyword. Therefore, there is no need to directly link each of the particle generation factors to each of the second information. Accordingly, it is possible to prepare or update the second information with ease.

In accordance with the above-mentioned charging method, the second keyword is extracted from document data related to a particle by text mining. In text mining, the document data are divided into a plurality of words and a main keyword is extracted based on a frequency of appearance or a correlation of the divided words. Therefore, even if the document data related to the particle are not arranged in order, it is possible to extract the main keyword.

In accordance with the above-mentioned charging method, the third keyword is extracted from each of the second information by text mining, prior to selection of the second information including document data. Therefore, when the second information is selected, the third keyword related to each of the second information already exists. Accordingly, it is possible to easily or promptly obtain the second information just by comparing the extracted third keyword with the first keyword or the second keyword.

BRIEF DESCRIPTION OF THE DRAWINGS

The disclosure may best be understood by reference to the following description taken in conjunction with the following figures:

FIG. 1 shows a schematic configuration of a particle generation factor determining system for performing a charging method in accordance with an embodiment of the present disclosure;

FIG. 6A is a plane view showing a position of each taper pad corresponding area in the particle map and FIG. 6B is an enlarged plane view showing the taper pad corresponding area and the taper pad peripheral area in the particle map;

FIG. 8A is a plane view showing ten areas equally divided in a peripheral area of a particle map, FIG. 8B show a graph plotting the number of particles in each area of FIG. 8A, and FIG. 8C is a plane view showing an edge area;

FIG. 10 shows a printout sheet of particle factor information outputted from the user interface device of FIG. 1.

DETAILED DESCRIPTION OF THE INVENTION

Figure 2A:
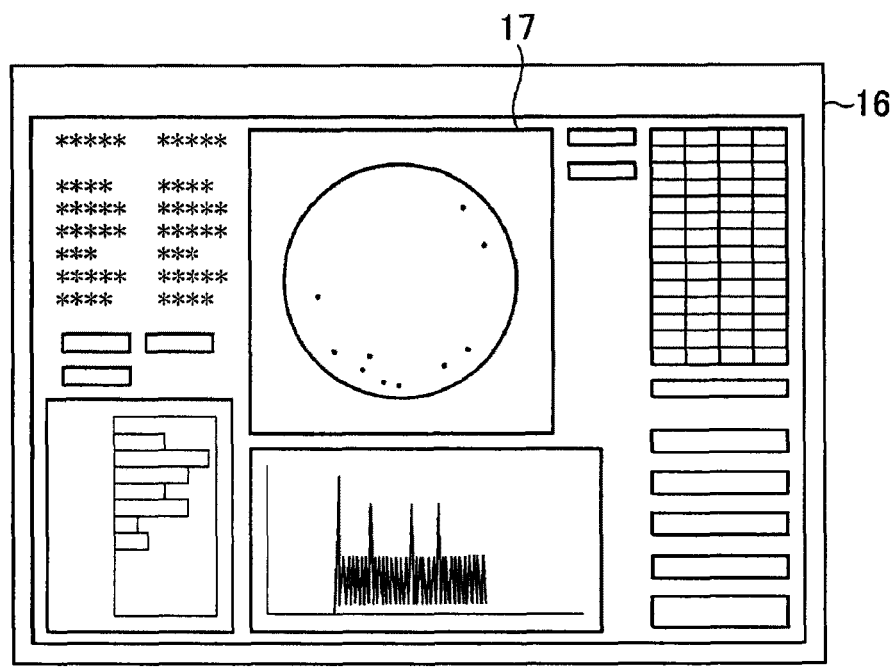
FIGS. 2A and 2B show images, which are displayed on a display unit of a user interface device of FIG. 1, for checking image data to be inputted and specifically, FIG. 2A show an image for checking captured image data of a wafer and FIG. 2B show an image for checking SEM image data.

Hereinafter, embodiments of the present disclosure will be described with reference to the accompanying drawings.

FIG. 1 shows a schematic configuration of a particle generation factor determining system for performing a charging method in accordance with the present embodiment.

In FIG. 1, a particle generation factor determining system 10 includes a user interface device 11 serving as a terminal through which a user inputs and outputs data; a server 13 which exchanges data with the user interface device 11 or a database device 12 to be described later; and the database device 12.

The particle generation factor determining system 10 determines a particle generation factor, for example, by performing an image analysis on image data inputted by user such as captured image data of a wafer to which particles are adhered or SEM (Scanning Electron Microscope) image data of the particles, or by performing a text analysis on document data related to a status of the particle adhesion inputted by the user. Further, the particle generation factor determining system 10 calculates a possibility that each particle generation factor is a true factor as a score (hereinafter, referred to as "accuracy"). Furthermore, the particle generation factor determining system 10 provides the user with information on each particle generation factor, such as a particle generating mechanism or a method of removing the particle generation factor, and charges a fee for providing such information.

Through experiments or researches, the present inventor has found that a main particle generation factor includes contact with a taper pad, friction with a focus ring, an attacked shoulder of the focus ring, transfer from a gas hole, a periphery bias, a COP (Crystal Originated Particle), precipitation dust, a reaction between water and a fluorocarbon-based gas, and particle generation in a metrology unit. The particle generation factor determining system 10 in accordance with the present embodiment calculates accuracy of each of the above-described particle generation factors.

By way of example, the user interface device 11 may be a personal computer. The user interface device 11 receives, as first information, SEM image data of the particles or image data of a wafer captured by the user. Further, the user interface device 11 includes a display unit 14 and the user may check and process the captured image data of the wafer or SEM image data from an image 15 displayed on the display unit 14 through a browser and may check a list of determined particle generation factors as well as accuracy of each particle generation factor. The browser in the user interface device 11 may be a typical commercial browser such as Internet Explorer (registered trademark) or a dedicated browser of the user interface device 11.

Figure 2B:
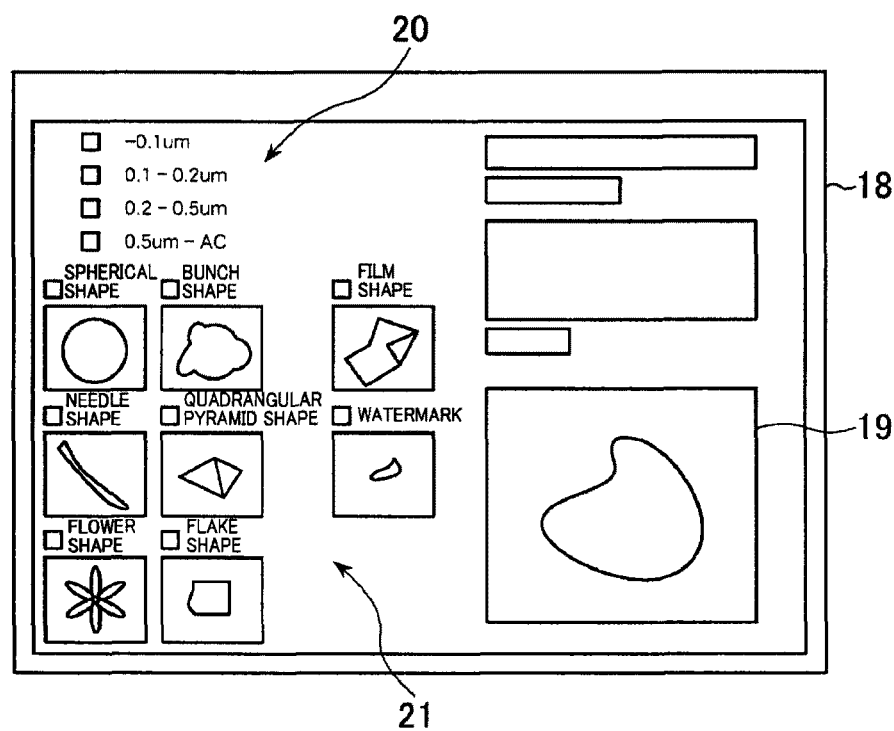

FIGS. 2A and 2B show images, which are displayed on the display unit of the user interface device of FIG. 1, for checking image data to be inputted and specifically, FIG. 2A show an image for checking captured image data of a wafer and FIG. 2B show an image for checking SEM image data.

A checking image 16 in FIG. 2A includes a frame 17 showing captured image data of the wafer, and the user determines a processing target range of the image data by drawing a circle of a desired diameter on the image data displayed on the frame 17. After the determination of the range, the image data within the range are transmitted to the server 13 as image data showing a distribution status of particles (hereinafter, referred to as "particle map").

A checking image 18 in FIG. 2B includes a frame 19 showing SEM image data of a particle, check box options 20 for setting a size of the particle, and check box options 21 for setting a schematic shape of the particle. The user selects the check box options 20 and 21 for setting a size and a shape of the particle while seeing the SEM image shown in the frame 19. Information on the set size and shape may be transmitted to the server 13 together with the SEM image data.

Further, the user interface device 11 may also receive document data such as text data (first information), related to a status of particle adhesion.

Figure 3:
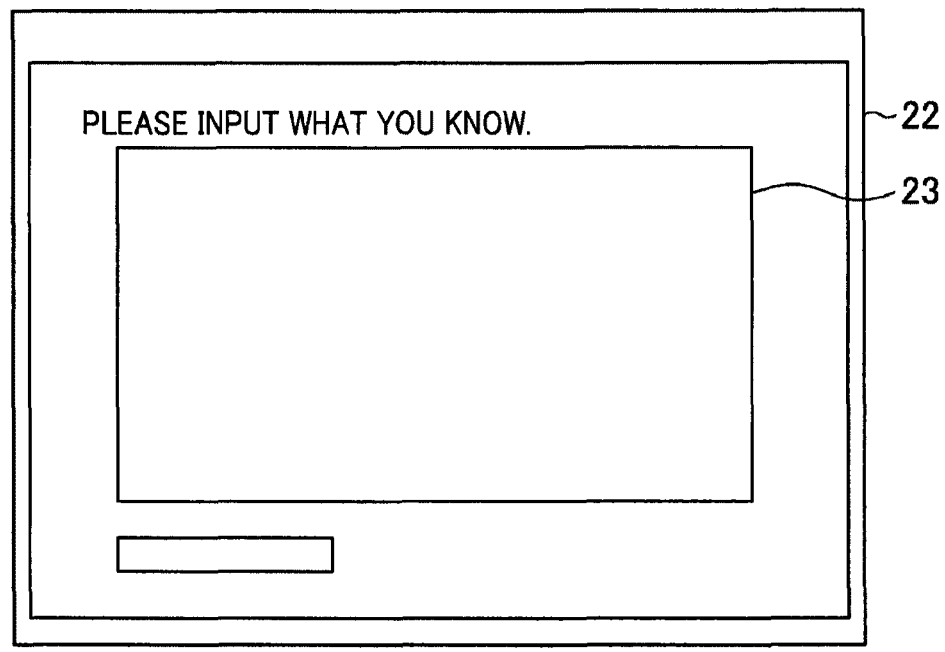
FIG. 3 show an image, which is displayed on the display unit of the user interface device of FIG. 1, for inputting text data.

FIG. 3 shows an image, which is displayed on the display unit of the user interface device of FIG. 1, for inputting text data.

An input image 22 in FIG. 3 includes a text input box 23. For the text data related to the status of particle adhesion, the user can copy text data from a certain document and paste the copied text data into the text input box 23 or directly input a sentence explaining the status of particle adhesion into the text input box 23.

The user interface device 11 has a function of text mining. In text mining, text data are divided into a plurality of words and a main keyword is extracted based on a frequency of appearance or a correlation of the divided words. Therefore, the user interface device 11 extracts a main keyword (second keyword) from text data inputted into the text input box 23 and transmits the extracted keyword (hereinafter, referred to as "text keyword") to the server 13.

The user interface device 11 may receive text data inputted into the text input box 23 as well as other document data written by commercial word processing software as data explaining the status of particle adhesion.

Further, the user interface device 11 may receive graph data as well as the image data and the document data. The user interface device 11 extracts the number of peaks or amplitude of data from the received graph data as a keyword and transmits the extracted keyword to the server 13.

Moreover, after checking a list of particle generation factors through the user interface device 11, the user can obtain information on a particle generating mechanism or a method of removing a particle generation factor. A method of obtaining such information will be explained in detail later.

The server 13 receives a particle map or text keywords from the user interface device 11. Further, a memory of the server 13 stores therein an image analysis program 24. The image analysis program 24 includes DLLs (Dynamic Link Libraries) for calculating accuracy of each particle generation factor. Further, a DLL as a part of the image analysis program 24 is not limited to the DLL stored in the memory of the server 13 and any DLL provided by another server may be a part of the image analysis program 24. Furthermore, the kind of DLL of the image analysis program 24 is not fixed. For example, the kind of DLL of the image analysis program can be varied depending on specifications of a substrate processing system.

The image analysis program 24 is executed by the server 13 equipped with a RAM and a CPU, and the server 13 calculates accuracy of each particle generation factor based on the particle map, the SEM image, and the shape and size of the particle (score calculating process).

Figure 4:
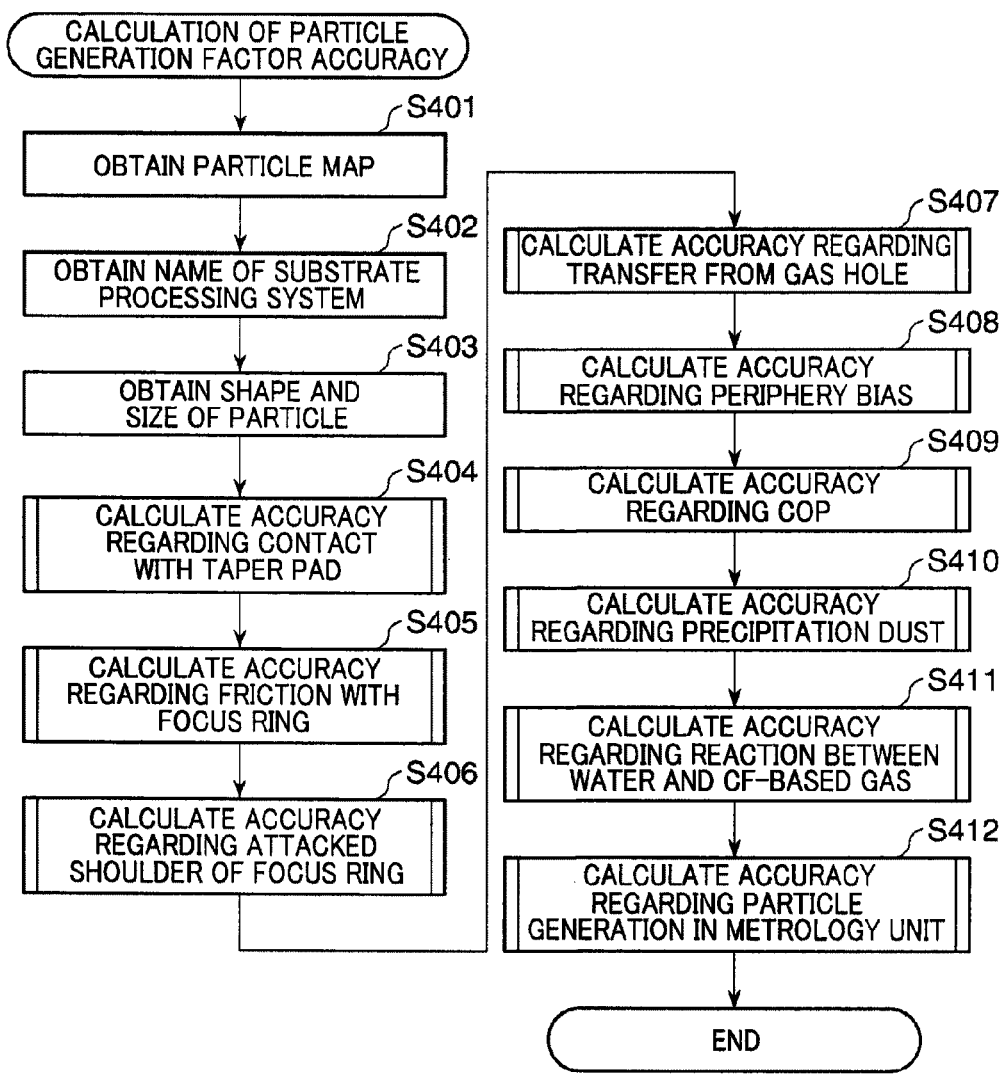
FIG. 4 is a flow chart showing a process of calculating accuracy of each particle generation factor by a server of FIG. 1.

FIG. 4 is a flow chart showing a process of calculating accuracy of a particle generation factor by the server of FIG. 1. This process is carried out by the CPU of the server 13 according to the image analysis program 24.

As shown in FIG. 4, from the user interface device 11, a particle map is first obtained (step S401), a name of a substrate processing system corresponding to the particle map is obtained (step S402), and a shape and size of a particle is obtained (step S403).

Then, accuracy regarding contact with a taper pad is calculated from the particle map or the data on a shape and size of each particle by using the image analysis program 24' DLL that calculates accuracy regarding contact with a taper pad (step S404). In this way, accuracy regarding friction with a focus ring is calculated (step S405); accuracy regarding an attacked shoulder of the focus ring is calculated (step S406); accuracy regarding transfer from a gas hole is calculated (step S407); accuracy regarding a periphery bias is calculated (step S408); accuracy regarding COPs is calculated (step S409); accuracy regarding precipitation dust is calculated (step S410); accuracy regarding a reaction between water and a CF-based gas is calculated (step S411); and accuracy regarding particle generation in a metrology unit is calculated (step S412).

Subsequently, the calculated accuracy regarding each of the particle generation factors is stored in the memory of the server 13 and the present process is then ended.

Hereinafter, among the above-described processes of calculating accuracy regarding each particle generation factor, "a process of calculating accuracy regarding contact with a taper pad" and "a process of calculating accuracy regarding friction with a focus ring" will be explained in detail as an example.

Figure 5:
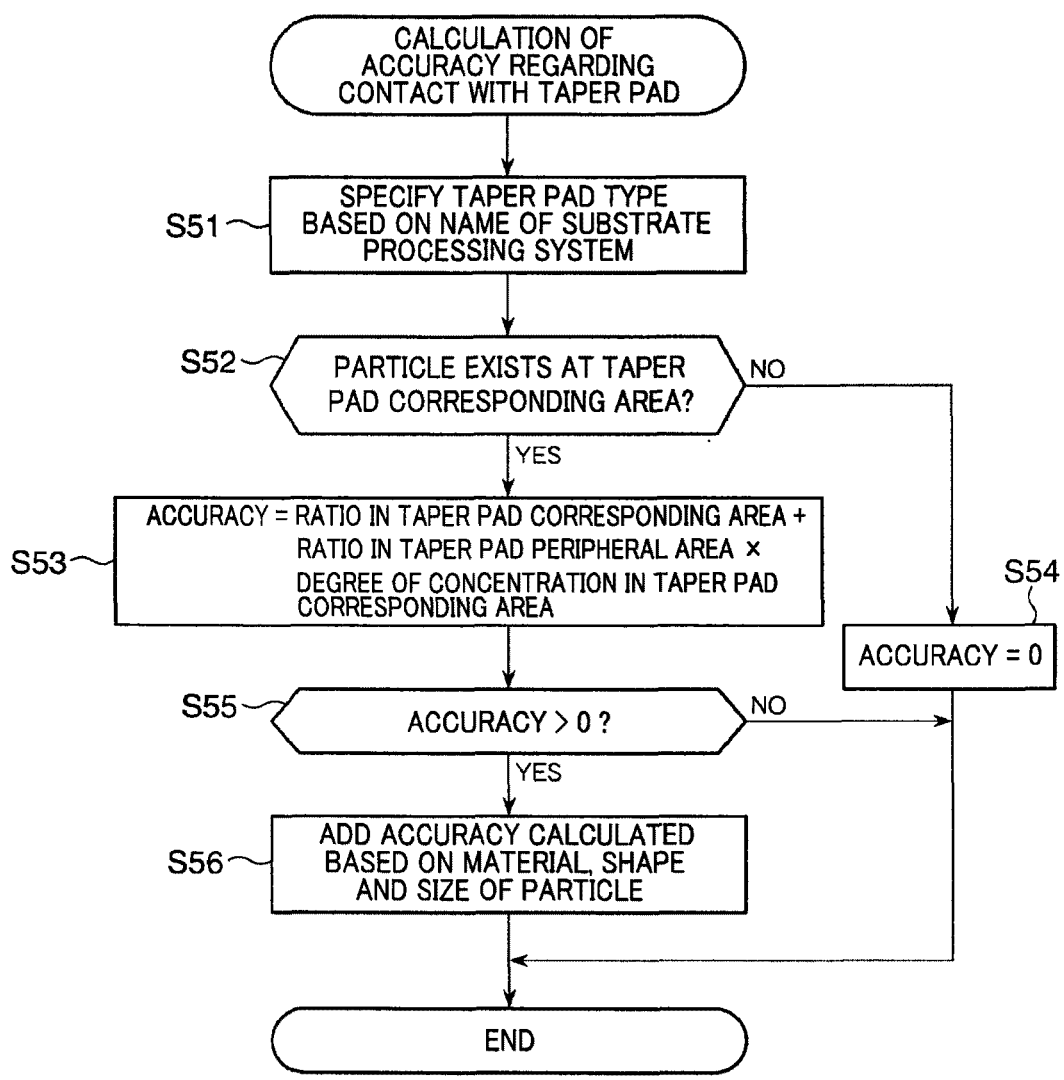
FIG. 5 is a flow chart showing a process of calculating accuracy regarding contact with a taper pad.

FIG. 5 is a flow chart showing a process of calculating accuracy regarding contact with a taper pad. Particles generated by contact between a wafer and a protruded taper pad provided on a transfer fork may be adhered to a portion of the wafer in contact with the taper pad. Therefore, in the process of FIG. 5, accuracy can be calculated based on a particle distribution density in the portion of the wafer in contact with the taper pad.

In FIG. 5, a shape of the transfer fork or a position and the number of taper pads on the transfer fork may vary depending on the kind of substrate processing system. Therefore, a type (for example, a position and the number) of the taper pads is specified based on the name of the substrate processing system which has been already obtained in step S402 of FIG. 4 (step S51).

Then, a portion of the wafer in contact with the taper pad is specified based on the specified position or number of the taper pads, and an area corresponding to the specified contact portion is set as a taper pad corresponding area 25 within the particle map and it is determined whether or not particles exist in this taper pad corresponding area 25 (step S52).

Figure 6A:
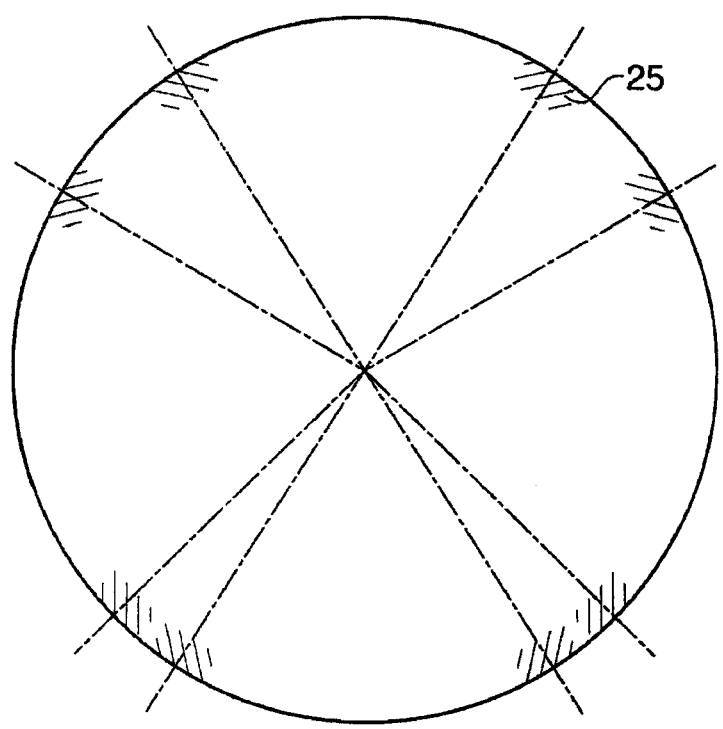
FIGS. 6A and 6B show taper pad corresponding areas and taper pad peripheral areas in a particle map and, particularly.

As indicated by shaded portions in FIG. 6a, the taper pad corresponding area 25 is in a rotational angular range of about ±5° from the contact portion with each taper pad with respect to the center of the particle map and is in a range of about 30 mm inward from the edge of the particle map. Further, FIG. 6A shows eight taper pads provided on the transfer pork.

Figure 6B:
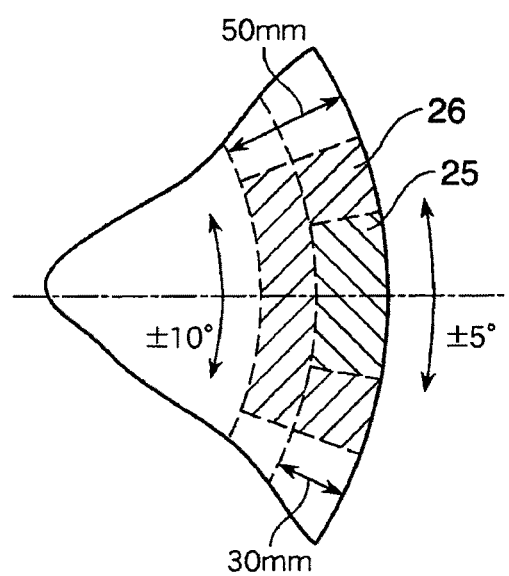

As a result of the determination in step S52, if there exist particles in the taper pad corresponding area 25, a ratio of the particles in the taper pad corresponding area, a ratio of the particles in a taper pad peripheral area, and a concentration degree of the particles in the taper pad corresponding area are calculated from the particle map. A taper pad peripheral area 26 surrounds the taper pad corresponding area 25. That is, the taper pad peripheral area 26 is in a rotational angular range of about ±10° from the contact portion with each taper pad with respect to the center of the particle map and is in a range of about 50 mm inward from the edge of the particle map, and the taper pad corresponding area 25 is excluded from the taper pad peripheral area 26 (see FIG. 6B).

The ratio of the particles in the taper pad corresponding area, the ratio of the particles in the taper pad peripheral area, and the concentration degree of the particles in the taper pad corresponding area are expressed by the following equations, respectively.

Ratio of the particles in the taper pad corresponding area=Particle distribution density in the taper pad corresponding area 25/Particle distribution density in the particle map in the radius range from about 200 mm to about 300 mm (outwards)

Ratio of particles in the taper pad peripheral area=Particle distribution density in the taper pad peripheral area 26/Particle distribution density in the particle map in the radius range from about 200 mm to about 300 mm (outwards)

Concentration degree of particles in the taper pad corresponding area=Number of the particles in the taper pad corresponding area 25/(Number of the particles in the taper pad corresponding area25+Number of the particles in the taper pad peripheral area 26)×100

Further, accuracy is calculated by the following equation (step S53) and the present process proceeds to step S55.

Accuracy=Ratio of particles in the taper pad corresponding area+Ratio of particles in the taper pad peripheral area×Concentration degree of particles in the taper pad corresponding area In step S55, it is determined whether or not the calculated accuracy is greater than 0, and if the calculated accuracy is 0, the present process is ended. If the calculated accuracy is greater than 0, accuracy based on the shape and size of the particle is added to this calculated accuracy (step S56) and the present process is ended.

In step S56, data, stored in the memory, on a representative shape and size of the particle generated by the contact with the taper pad is compared with the data on the shape and size of each particle which has been obtained in step S403 of FIG. 4. If degree of conformity in the shape and size is equal to or greater than a predetermined threshold value, the contact with the taper pad is deemed to be a particle generation factor of a high possibility and its accuracy is set to be 5.

As a result of the determination in step S52, if particles do not exist in the taper pad corresponding area 25, accuracy is set to be 0 (step S54) and the present process is ended.

Figure 7:
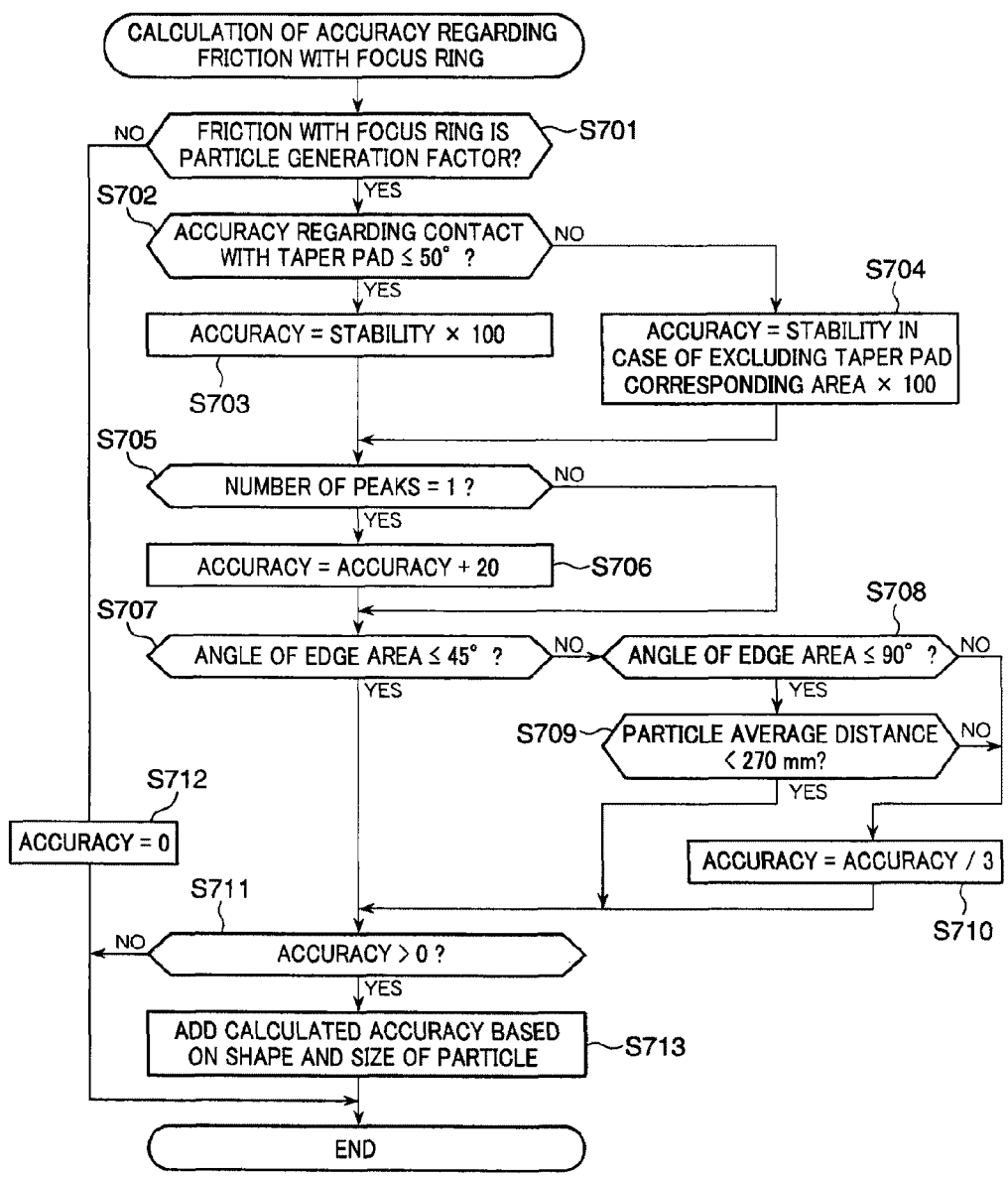
FIG. 7 is a flow chart showing a process of calculating accuracy regarding friction with a focus ring.

FIG. 7 is a flow chart showing a process of calculating accuracy regarding friction with a focus ring. Particles generated by friction between a focus ring and a wafer may be usually adhered to a peripheral portion of the wafer. Here, the friction means a local contact between the wafer and the focus ring, and, thus, the particles may be locally and relatively inwardly distributed in the peripheral portion of the wafer. Therefore, in the process of FIG. 7, accuracy can be calculated based on a particle distribution density in the peripheral portion of the wafer.

The focus ring varies depending on the kind of substrate processing system, and in some kinds of substrate processing system, friction between the focus ring and the wafer may not occur. Thus, in the process of FIG. 7, it is determined whether or not friction with the focus ring is a particle generation factor based on the name of the substrate processing system which has been already obtained in step S402 of FIG. 4 (step S701).

As a result of the determination in step S701, if the friction with the focus ring is the particle generation factor, it is determined whether or not accuracy regarding contact with the taper pad is equal to or less than 50 (step S702).

As a result of the determination of step S702, if the accuracy regarding contact with the taper pad is equal to or less than 50, accuracy is calculated from the following equation (step S703) and the process proceeds to step S705.

Accuracy=Stability×100

Here, the stability is calculated from the following equation.

Stability=Vector average/Scalar average

Here, the scalar average is an average distance of all particles positioned in an area having a radius of about 250 mm or greater from the center of the particle map, and the vector average is a distance between a coordinate origin which is the center of the particle map and a point corresponding to an average X-component and an average Y-component. Here, the average X-component and average Y-component are obtained by respectively averaging X-components and Y-components of position vectors of all the particles positioned in the area having a radius of about 250 mm or greater from the coordinate origin in the particle map.

As a result of the determination of step S702, if the accuracy regarding contact with the taper pad is greater than 50, accuracy is calculated from the following equation (step S704) and the process proceeds to step S705.

Accuracy=Stability in case of excluding a taper pad
corresponding area×100

The stability in case of excluding a taper pad corresponding area is a stability of all particles positioned in the area having a radius of about 250 mm or greater in the particle map, excluding the taper pad corresponding area. This stability can also be calculated from the above-described equation.

Figure 8A:
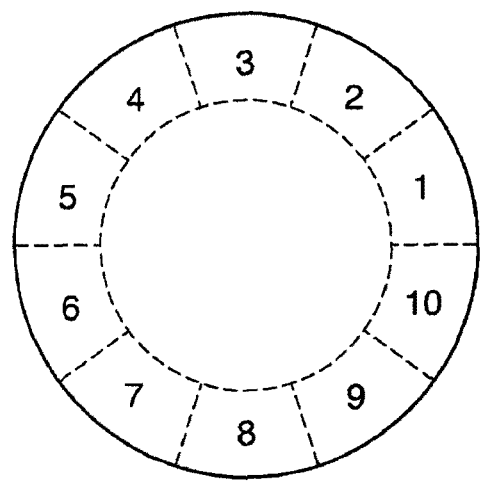
FIGS. 8A to 8C show data used in calculating accuracy regarding friction with a focus ring and, particularly.

Then, it is determined whether or not the number of peaks in the peripheral portion of the wafer is 1 (step S705). In this case, when the area having a radius of about 200 mm or greater in the particle map is equally divided into ten areas in a circumferential direction (see FIG. 8A), the number of particles positioned in each of the ten areas 1, 2, 3 . . . are plotted on a graph (see FIG. 8B). In this graph, if a difference between the number of particles in a predetermined area and the number of particles in its adjacent area is greater than a standard deviation of the number of particles in the whole area, the predetermined area is defined as a peak (corresponding to area 9 in FIG. 8B).

As a result of the determination of step S705, if the number of peaks is 1, 20 are added to accuracy (step S706) and the process proceeds to step S707. However, if the number of peaks is not 1, the process proceeds to step S707.

Subsequently, it is determined whether or not an angle of an edge area is equal to or less than 45° (step S707). If the angle of the edge area is equal to or less than 45°, the process proceeds to step S711 and if the angle of the edge area is greater than 45°, the process proceeds to step S708.

Figure 8B:
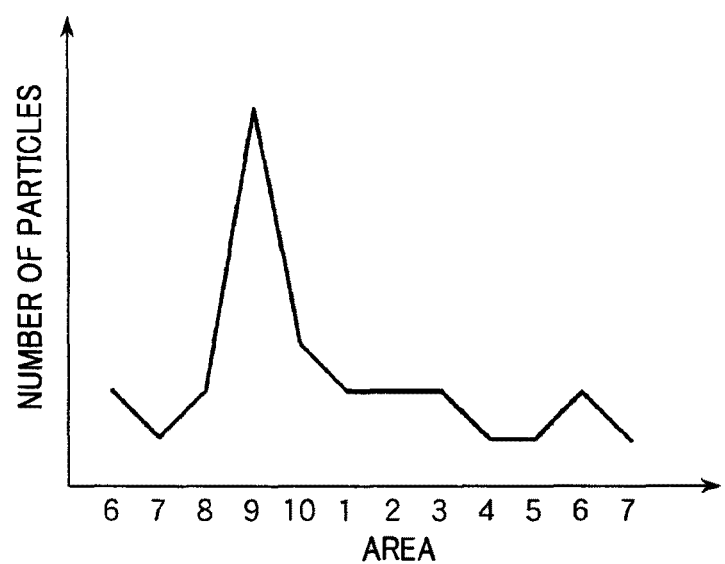
Figure 8C:
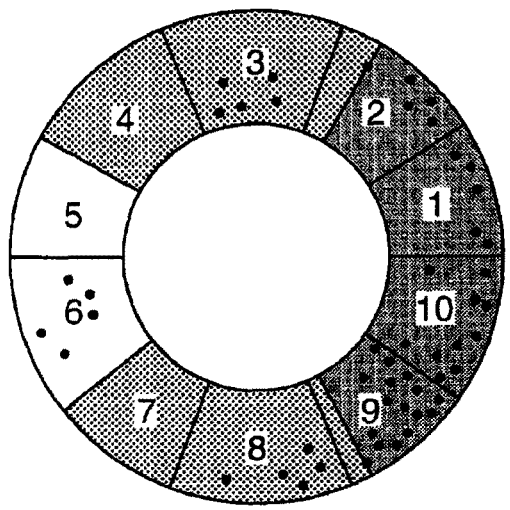

Here, in a middle area between two valleys (area 7 and area 4) with the peak (area 9) therebetween in FIG. 8B, the edge area is an area (corresponding to dark portions of FIG. 8C) including more than 90% particles among all particles in the middle area.

In step S708, it is determined whether or not an angle of the edge area is equal to or less than 90°. If the angle of the edge area is equal to or less than 90°, it is determined whether or not an average distance (hereinafter, referred to as "particle average distance") from the center of the particle map to all particles positioned in the area having a radius of about 200 mm or greater in the particle map is smaller than 270 mm (step S709). If the particle average distance is smaller than 270 mm, the process proceeds to step S711.

If the angle of the edge area is greater than 90° as a result of the determination of step S708 and if the particle average distance is 270 mm or greater as a result of the determination of step S709, accuracy is divided by 3 (step S710) and the process proceeds to step S711.

In step S711, it is determined whether or not the calculated accuracy is greater than 0. If the calculated accuracy is 0, the present process is ended. However, if the calculated accuracy is greater than 0, in the same manner as step S56 of FIG. 5, accuracy regarding a particle generation factor based on a shape and size of a particle is added to the calculated accuracy (step S713) and the present process is ended.

Further, as a result of the determination of step S701, if friction with the focus ring is not a particle generation factor, accuracy is set to be 0 (step S712) and the present process is ended.

Furthermore, other processes of calculating accuracy except "process of calculating accuracy regarding contact with the taper pad" and "process of calculating accuracy regarding friction with the focus ring" are disclosed in the specification of Japanese patent application No. 2008-056431 in detail.

The server 13 stores keywords related to each particle generation factor in the memory, obtains keywords (first keyword) related to a particle generation factor having high accuracy from the memory, and transmits the obtained keywords (hereinafter, referred to as "image keyword") to the database device 12. Alternatively, the memory may not store keywords therein. In this case, keywords may be written in a program code executed by the DLL for calculating accuracy of each particle generation factor and the server 13 may obtain the written keywords.

As a keyword obtained by the server 13, there may be, for example, "taper pad" or "transfer fork" from "process of calculating accuracy regarding contact with the taper pad" and "focus ring," "peripheral portion" or "local" from "process of calculating accuracy regarding friction with the focus ring."

Further, a keyword transmitted by the server 13 is not limited to an image keyword and may include a text keyword transmitted from the user interface device 11 to the server 13.

Furthermore, the server 13 transmits, to the user interface device 11, a diminutive of a particle generation factor having high accuracy (for example, only "taper pad" from "contact with the taper pad" and only "gas hole" from "gas hole transfer") and accuracy thereof. Then, the server receives generation-factor-relevant information 27 from the database device 12 as described later and transmits a title, a particle source, and a category of the received generation-factor-relevant information 27 to the user interface device 11. When transmitting the generation-factor-relevant information 27 to the user interface device 11, the server 11 calculates a fee to be charged for providing such information.

The database device 12 stores lots of information related to each particle generation factor (second information) (hereinafter, referred to as "generation-factor-relevant information) as document data. The generation-factor-relevant information 27 may include document data in which knowledge of a developer of the substrate processing system is written or document data regarding particle generation. Further, the database device 12 has a function of text mining and extracts a main keyword (third keyword) from each of the generation-factor-relevant information 27 and stores therein the main keyword prior to the process shown in FIG. 4. Each of the generation-factor-relevant information 27 includes the title, the particle source, and the category as a keyword in addition to the keyword extracted by text mining. The title concisely expresses a content of the generation-factor-relevant information 27, the particle source means a generation source of a particle related to the generation-factor-relevant information 27, and the category is a classification of the content of the generation-factor-relevant information 27, such as a particle generating mechanism or a method of removing the particle generation factor. These keywords are set to be related to the generation-factor-relevant information 27 by a high-end user or a system manager. Hereinafter, a keyword of each of the generation-factor-relevant information 27 will be referred to as "relevant information keyword."

In addition to the relevant information keyword, the generation-factor-relevant information 27 further includes an index of a value of the generation-factor-relevant information 27. This index shows economic merit which a user can obtain from the generation-factor-relevant information 27 as an amount of money, and hereinafter, the index is referred to as "ROK (Return on Knowledge)." The ROK includes an initial value set by the high-end user or the system manager and a feedback value (evaluation value of a former user about the second information) set by the user using the generation-factor-relevant information 27 in consideration of the actually obtained economic merit.

If the database device 12 receives the image keyword or the text keyword from the server 13, the database device 12 compares the image keyword or the text keyword with the relevant information keyword; selects generation-factor-relevant information 27 corresponding to the relevant information keyword having a high degree of coincidence with the image keyword or the text keyword; and transmits the selected relevant information keyword to the server 13. At this time, the database device 12 transmits, to the server 13, a title, a particle source, and a category of the generation-factor-relevant information 27 and its ROK together with the generation-factor-relevant information 27.

The generation-factor-relevant information 27 need not be stored in the database device 12 and may be stored in an external database device connected to the database device 12. In this case, it is also required to extract a main keyword from the generation-factor-relevant information 27 stored in the external database device by text mining and the database device 12 needs to store the extracted keyword therein prior to the process of FIG. 4.

The database device 12 has a function of text mining, and, thus, document data which has been already accumulated in the past but not arranged in order can be also used as generation-factor-relevant information 27.

If the server 13 receives the generation-factor-relevant information 27, its corresponding title, particle source, category, and the ROK from the database device 12, the server 13 transmits, to the user interface device 11, a diminutive of a particle generation factor corresponding to the received generation-factor-relevant information 27; accuracy of the particle generation factor; and the title, particle source, and category of the received generation-factor-relevant information 27.

If the user interface device 11 receives the generation-factor-relevant information 27 or the like from the server 13, the user interface device 11 displays the generation-factor-relevant information 27 as a result of analysis on the display unit 14 (information displaying process).

Figure 9:
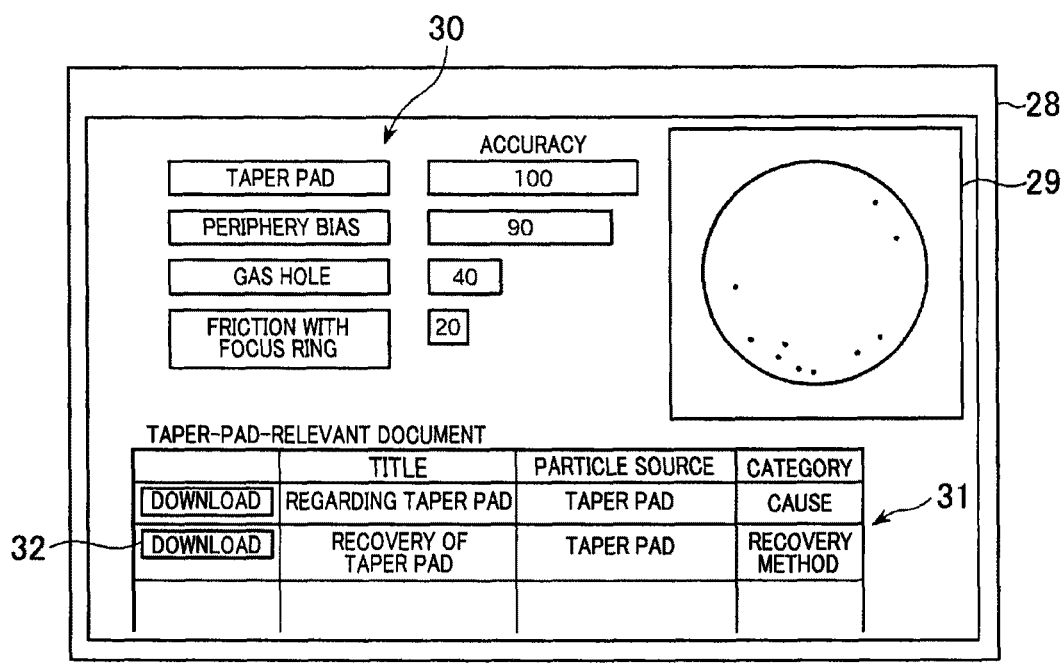
FIG. 9 show an analysis result image displayed on the display unit of the user interface device of FIG. 1.

FIG. 9 shows an analysis result image displayed on the display unit of the user interface device of FIG. 1.

An analysis result image 28 of FIG. 9 includes a frame 29 for showing a particle map; an accuracy list 30 for listing a diminutive and accuracy of the received particle generation factor; and a relevant information list 31 for listing a title, a particle source, and a category (a part of the second information) of the received generation-factor-relevant information 27. Since the generation-factor-relevant information 27 of which the title is listed on the relevant information list 31 has been selected based on an image keyword of a particle generation factor having high accuracy, it is possible to provide the user with the generation-factor-relevant information 27 related to the particle generation factor having high accuracy. Further, the relevant information list 31 includes download buttons 32 each corresponding to each title.

If the user selects the download button 32 of the relevant information list 31 through a mouse click, generation-factor-relevant information 27 having a title corresponding to the selected download button 32 is transmitted and provided from the server 13 to the user interface device 11 in the form of document data such as PDF-format data.

When the provided generation-factor-relevant information 27 is printed out by a printer (not illustrated) or the like, the user interface device 11 can print an IP address of the user interface device 11 or personal information of the user such as an e-mail address as a background together with the generation-factor-relevant information 27 on a printout sheet in order to specify the user (see FIG. 10). Accordingly, it is possible to prevent illegal uses of the printed generation-factor-relevant information 27.

The particle generation factor determining system 10 charges a fee for providing the user interface device 11 with the generation-factor-relevant information 27 requested by the user (charging process). The fee to be charged can be calculated by the following equation (1).

Fee to be charged=ROK (including both an initial value and a feedback value)×Coefficient of ROK×Accuracy of a particle generation factor related to provided generation-factor-relevant information 27×Frequency of selection, so far, of the generation-factor-relevant information 27     (1)

"Coefficient of ROK" is a coefficient set by the high-end user or the system manager in order to adjust the fee to be charged to an appropriate amount, and "frequency of selection of the generation-factor-relevant information 27 (until now)" is a ratio of the number of selection of the generation-factor-relevant information 27 based on an image keyword or a text keyword (until now) to the number of determination of particle generation factors (until now).

For example, if an initial value of the ROK is ten million yen (Y), a feedback value of the ROK is 10 million yen, a coefficient of the ROK is 0.1, accuracy is 0.90, and a frequency of selection is 0.5 (i.e., when the generation-factor-relevant information 27 is selected five hundred times from one thousand times of determination), the fee to be charged is nine hundred thousand yen.

The above-described method of calculating a fee to be charged is an example. It may be possible to calculate the fee to be charged by using at least one of contribution of the generation-factor-relevant information 27 to a profit in a production line of a semiconductor device or contribution to development of a substrate processing system (contribution of second information to a profit), the number of times the generation-factor-relevant information 27 has been provided until now, and an elapsed time from when the generation-factor-relevant information 27 was last provided. Especially, accuracy needs to be used in calculating the fee to be charged.

The user interface device 11 provides the generation-factor-relevant information 27 in various ways depending on a level of the user such as an information access permission level, when providing the generation-factor-relevant information 27. For example, to a normal user, all contents described in document data of the generation-factor-relevant information 27 can be provided on a printout sheet, but to a user of a low information access permission level, only a summary of the contents described in the document data can be provided on a printout sheet. Further, to a user testing the particle generation factor determining system 10, the contents described in the document data are not printed out but just displayed on the display unit 14 of the user interface device 11. The particle generation factor determining system 10 may change the amount of the fee to be charged based on a way of providing the generation-factor-relevant information 27. For example, in the charging fee calculated by the above-described equation (1), a coefficient can be applied based on a way of providing the generation-factor-relevant information 27. To be specific, when all the contents described in the document data are provided, the coefficient may set to be 1.0; when only the summary of the contents described in the document data is provided, the coefficient may set to be 0.3; and when only a title of the contents described in the document data is displayed on the display unit 14, the coefficient may set to be 0.0.

Further, even if all the contents described in the document data of the generation-factor-relevant information 27 are provided to the user, the user may obtain different economic merits depending on a category of the generation-factor-relevant information 27. For example, if a generating mechanism is provided, it is not easy for the user to remove the particle generation factor, and, thus, the user may obtain a low economic merit. However, if a method of removing the particle generation factor is provided, it is easy for the user to remove the particle generation factor and, thus, the user may obtain a high economic merit. Therefore, the particle generation factor determining system 10 can change the amount of the fee to be charged based on a category of the generation-factor-relevant information 27. For example, in the charging fee calculated by the above-described equation (1), a coefficient can be applied based on a category of the generation-factor-relevant information 27. To be specific, when a category of the generation-factor-relevant information 27 is a generating mechanism, the coefficient may set to be 0.3, and when a category of the generation-factor-relevant information 27 is a method of removing the particle generation factor, the coefficient may set to be 1.0.

In accordance with the particle generation factor determining system 10 for performing a charging method of the present embodiment, accuracy of each of multiple particle generation factors is calculated based on a particle map and a fee to be charged for providing particle generation-factor-relevant information 27 is determined based on accuracy of a particle generation factor corresponding to the provided generation-factor-relevant information 27. Therefore, it is highly likely that a particle generation factor corresponding to generation-factor-relevant information 27 of a high fee charged therefor is a true particle generation factor. Accordingly, it is easy for the user to know cost effectiveness of using the particle generation factor determining system 10, and, thus, it is possible to offer the user an incentive to use the particle generation factor determining system 10.

In the above-described particle generation factor determining system 10, a fee to be charged may be determined based on at least one of contribution of the generation-factor-relevant information 27 to a profit in a production line of a semiconductor device or contribution to development of a substrate processing system, a feedback value set by the user using the generation-factor-relevant information 27 in consideration of the actually obtained economic merit, the number of times the generation-factor-relevant information 27 has been provided until now, and an elapsed time from when the generation-factor-relevant information 27 was last provided. Therefore, a value of the generation-factor-relevant information 27 can be reflected in the fee to be charged, and, thus, it is possible to determine the reasonable fee to be charged.

Further, in the above-described particle generation factor determining system 10, a fee to be charged is determined based on a way of providing generation-factor-relevant information 27. Therefore, it is possible to set the fee to be charged appropriately based on a degree of use of the generation-factor-relevant information 27.

Furthermore, in the above-described particle generation factor determining system 10, a fee to be charged is determined based on a category of generation-factor-relevant information 27. Therefore, it is possible to set the fee to be charged appropriately based on economic merit which a user can obtain from the generation-factor-relevant information 27.

In the above-described particle generation factor determining system 10, accuracy of a particle generation factor is calculated based on a result of an image analysis of a particle map, and generation-factor-relevant information 27 related to a particle generation factor having high accuracy is provided. Therefore, it is possible for a user to obtain the generation-factor-relevant information 27 just by preparing image data of a wafer obtained by capturing the wafer, thereby saving the user a lot of trouble.

In the above-described particle generation factor determining system 10, an image keyword is obtained and generation-factor-relevant information 27 is obtained based on the obtained image keyword. Therefore, there is no need to directly link each particle generation factor to each of the generation-factor-relevant information 27. Accordingly, it is possible to prepare or update the generation-factor-relevant information 27 with ease.

In the above-described particle generation factor determining system 10, a text keyword is extracted from text data inputted into a text input box 23 by text mining. Therefore, even if the text data inputted into the text input box 23 are not arranged in order, it is possible to extract the text keyword.

In the above-described particle generation factor determining system 10, a relevant information keyword is extracted from each of generation-factor-relevant information 27 by text mining prior to a process of FIG. 4 or prior to selection of the generation-factor-relevant information 27. Therefore, when the generation-factor-relevant information 27 is selected, the relevant information keyword already exists. Accordingly, it is possible to easily or promptly obtain the required generation-factor-relevant information 27 just by comparing the extracted relevant information keyword with an image keyword or a text keyword.

In the above-described particle generation factor determining system 10, a user does not know a fee to be charged.

However, before generation-factor-relevant information 27 is provided, to be specific, when the user selects a download button 32, a fee to be charged for providing generation-factor-relevant information 27 of a title corresponding to the selected download button 32 may be calculated and provided to the user. Accordingly, the user can know in advance a value of the generation-factor-relevant information 27 and can determine whether or not to obtain the generation-factor-relevant information 27.

Further, in the above-described particle generation factor determining system 10, a fee history charged for each of generation-factor-relevant information 27 may be recorded. Accordingly, contribution to a profit by a developer of a substrate processing system, who provides the particle generating-relevant information 27 to the particle generation factor determining system 10, becomes clear, and, thus, it is possible to offer the developer with an improved incentive of providing information to the particle generation factor determining system 10.

In order to achieve the present disclosure, a storage medium, which stores therein a software program for executing the function of the above-described embodiment, may be provided to the server 13 and the CPU of the server 13 may read and execute the program stored in the storage medium.

In this case, the program read from the storage medium executes the function of the above-described embodiment and the program and the storage medium storing the program therein are a part of the present disclosure.

Further, a storage medium for providing the program may include any medium that can store the program, e.g., RAM, NV-RAM, floppy (registered trademark) disc, hard disc, magneto-optical disc, optical disc such as CD-ROM, CD-R, CD-RW or DVD (DVD-ROM, DVD-RAM, DVD-RW, DVD+RW), a magnetic tape, a non-volatile memory card, and other ROMs. Alternatively, the program may be provided to the server 13 by downloading it from another non-illustrated computer or database connected to Internet, a commercial network or a local area network.

Furthermore, the function of the above-described embodiment can be achieved by executing the program read by the CPU of the server 13, and an operating system (OS) operated in the CPU performs a part or all of actual processes in response to an instruction of the program, so that the function of the above-described embodiment can be achieved.

Moreover, after the program read from the storage medium is written in a memory included in a function extension board inserted into the server 13 or a function extension unit connected to the server 13, a CPU included in the function extension board or the function extension unit performs a part or all of actual processes in response to an instruction of the program, so that the function of the above-described embodiment can be achieved.

The program may be an object code, a program executed by an interpreter, or script data provided to the OS.

What is claimed is:

1. A charging method in a particle generation factor determining system including a user interface device through which a user inputs first information on a particle adhered to a substrate and having a display, and a server which checks a possibility of each of multiple particle generation factors, the method comprising:
 a score calculating process in which the server receives the inputted first information and calculates the possibility of each of the multiple particle generation factors as a score based on the received first information;
 an information displaying process in which the user interface device displays, on the display, the calculated score and a part of second information on the particle generation factor corresponding to the score; and
 a charging process in which the server provides the second information to the user interface device in response to selection of the displayed part of the second information and charges a fee for providing the second information,
 wherein in the charging process, the charged fee is determined based on the score of the particle generation factor corresponding to the provided second information, and
 all of the second information or detailed information of the second information is provided to the user interface device, and
 the server obtains a first keyword related to each of the multiple particle generation factors and selects and obtains the second information based on the obtained first keyword.

2. The charging method of claim 1, wherein in the charging process, the charged fee is determined based on at least one of contribution of the second information to a profit, an evaluation value of a former user about the second information, the number of times the second information has been provided until now, and an elapsed time from when the second information was last provided.

3. The charging method of claim 1, wherein in the charging process, the charged fee is determined based on a way of providing the second information.

4. The charging method of claim 1, wherein in the charging process, the charged fee is determined based on a category of the second information.

5. The charging method of claim 1, wherein the first information includes image data of the particle,
 in the information displaying process, the server calculates the score based on a result of an image analysis of the image data.

6. The charging method of claim 1, wherein the first information includes document data related to the particle,
 the user interface device extracts a second keyword from the document data by text mining, and
 the server selects and obtains the second information based on the extracted second keyword.

7. The charging method of claim 1, wherein the particle generation factor determining system further includes a database device,
 the second information including document data is stored in the database device, and
 the database device extracts a third keyword from the second information by text mining, prior to the selection of the second information.

8. A particle generation factor determining system comprising:
 a user interface device configured for user input of first information on a particle adhered to a substrate and having a display; and
 a server configured to check a possibility of each of multiple particle generation factors, wherein:
 the server receives the inputted first information and calculates the possibility of each of the multiple particle generation factors as a score based on the received first, information;
 the user interface device displays, on the display, the calculated score and a part of second information on the particle generation factor corresponding to the score;
 the server provides the second information to the user interface device in response to selection of the displayed part of the second information and charges a fee for providing the second information, the charged fee for providing the second information determined based on the score of the particle generation factor corresponding to the provided second information, all of the second information or detailed information of the second information being provided to the user interface device, and the server obtains a first keyword related to each of the multiple particle generation factors and selects and obtains the second information based on the obtained first keyword.

9. A non-transitory computer-readable storage medium that stores a program for executing a charging method in a particle generation factor determining system including a user interface device through which a user inputs first information on a particle adhered to a substrate and having a display, and a server which checks a possibility of each of multiple particle generation factors, the charging method including:

a score calculating process in which the server receives the inputted first information and calculates the possibility of each of the multiple particle generation factors as a score based on the received first information;

an information displaying process in which the user interface device displays, on the display, the calculated score and a part of second information on the particle generation factor corresponding to the score; and a charging process in which the server provides the second information to the user interface device in response to selection of the displayed part of the second information and charges a fee for providing the second information, wherein in the charging process, the charged fee is determined based on the score of the particle generation factor corresponding to the provided second information, all of the second information or detailed information of the second information is provided to the user interface device, and the server obtains a first keyword related to each of the multiple particle generation factors and selects and obtains the second information based on the obtained first keyword.

* * * * *

UNITED STATES PATENT AND TRADEMARK OFFICE
CERTIFICATE OF CORRECTION

PATENT NO. : 8,498,911 B2
APPLICATION NO. : 12/820692
DATED : July 30, 2013
INVENTOR(S) : Tsuyoshi Moriya Page 1 of 1

It is certified that error appears in the above-identified patent and that said Letters Patent is hereby corrected as shown below:

In the Specification, column 10, line 60, add --13-- after the word server.
In the Claims, column 16, line 10, claim 1, remove "and".

Signed and Sealed this
Twenty-second Day of October, 2013

Teresa Stanek Rea
*Deputy Director of the United States Patent and Trademark Office*